United States Patent
Smith et al.

(10) Patent No.: US 6,229,634 B1
(45) Date of Patent: May 8, 2001

(54) BURST MODE OPTICAL RECEIVER AND REPEATER

(75) Inventors: Philip John Smith; Samuel Tennyson Jewell, both of Ipswich (GB)

(73) Assignee: British Telecommunications public limited company, London (GB)

( * ) Notice: Subject to any disclaimer, the term of this patent is extended or adjusted under 35 U.S.C. 154(b) by 0 days.

(21) Appl. No.: 09/011,784

(22) PCT Filed: Aug. 21, 1996

(86) PCT No.: PCT/GB96/02040

§ 371 Date: Mar. 11, 1998

§ 102(e) Date: Mar. 11, 1998

(87) PCT Pub. No.: WO97/08857

PCT Pub. Date: Mar. 6, 1997

(30) Foreign Application Priority Data

Aug. 24, 1995 (EP) .................................................. 95305815

(51) Int. Cl.[7] .................................................. H04B 10/06
(52) U.S. Cl. .......................... 359/191; 359/162; 359/189
(58) Field of Search .................................. 359/190–191, 359/162, 176, 189; 455/189–1, 209, 326; 375/325

(56) References Cited

U.S. PATENT DOCUMENTS

| 4,340,975 | * | 7/1982 | Onishi et al. | 455/315 |
| 4,949,397 | * | 8/1990 | Smoot | 359/146 |
| 5,274,490 | * | 12/1993 | Tsushima et al. | 359/191 |
| 5,307,196 |   | 4/1994 | Kinoshita | 359/189 |

FOREIGN PATENT DOCUMENTS

| 0632579 A3 | 5/1994 | (EP) . |
| 0632579 A2 | 1/1995 | (EP) . |
| WO 94/15409 | 7/1994 | (WO) . |

OTHER PUBLICATIONS

Horowitz et al, Textbook "The Art of Electronics", pp. 895–896, 1993.
Patent Abstracts of Japan, vol. 018, No. 369 (E–1576) Jul. 12, 1994 & JP,A,06 098365 (A T R Koudenpa Tsushin Kenkyusho:KK), Apr. 8, 1994.

* cited by examiner

Primary Examiner—Kinfe-Michael Negash
(74) Attorney, Agent, or Firm—Nixon & Vanderhye P.C.

(57) ABSTRACT

A burst mode optical digital receiver includes an opto-electronic detector up-converter for up-converting the frequency of the output of the opto-electronic detector, an amplifier for amplifying the up-converted signal, and down-converter for down-converting the frequency of the amplified signal.

29 Claims, 3 Drawing Sheets

CONVENTIONAL SIGNAL

BURST MODE

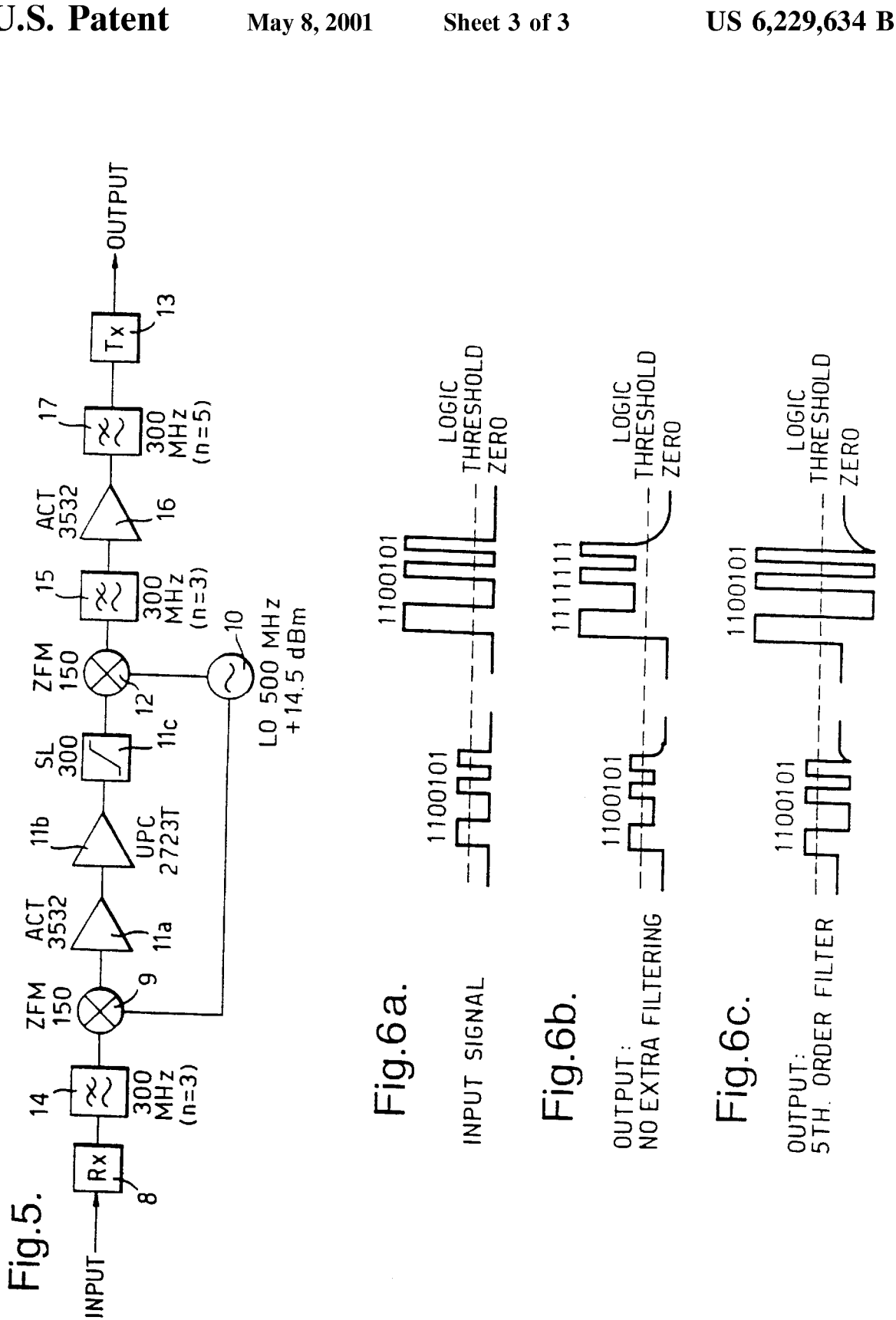

BURST MODE OPTICAL RECEIVER AND REPEATER

BACKGROUND OF THE INVENTION

1. Field of the Invention

This invention relates to a receiver for use in an optical network, and in particular to a burst mode digital receiver for use in such a network.

2. Related Art

Currently, in the United Kingdom, the telecommunications network includes a trunk network which is substantially completely constituted by optical fibre, and a local access network which is substantially completely constituted by copper pairs. In future, it would be highly desirable to have a fixed, resilient, transparent telecommunications infrastructure all the way to customer premises, with capacity for all foreseeable service requirements—or at least a point (e.g. the curb closer to such customer premises. One way of achieving this would be to create a fully-managed fibre network for the whole access topography. An attractive option for this is an optical tree access network, such as a passive optical network (PON) which incorporates single mode optical fibre and no bandwidth-limiting active electronics.

In a PON, a single fibre is fed out from a head-end (exchange), and is fanned out via passive optical splitters at cabinets and distribution points (DPs) to feed optical network units (ONUs). The ONUs can be in customers' premises, or in the street serving a number of customers. The use of optical splitters enables sharing of the feeder fibre and the exchange-based optical line termination (OLT) equipment, thereby giving PONs cost advantages. At present, simplex deployment of PONs is the preferred option, that is to say separate upstream and downstream PONs are provided whereby each customer has two fibres. Although simplex working increases the complexity of the infrastructure due to the two fibres per circuit required, it benefits from a low optical insertion loss (due to the absence of duplexing couplers), and a low return loss, since such systems are insensitive to reflections of less than 25 dB with separate transmit and receive paths. However, duplex PONs where one single fibre carries traffic in both directions are also possible. Typically, a PON has a four-way split followed by an eight-way split, so that a single head-end fibre can serve up to 32 customers.

In a known arrangement—TPON (telephony over a passive optical network)—a head-end station broadcasts time division multiplexed (TDM) frames to all the terminations on the network. The transmitted frames include both traffic data and control data. Each termination recognises and responds to appropriately-addressed portions of the data in the broadcast frames, and ignores the remainder of the frames. In the upstream direction, transmission is by time division multiple access (TDMA) where each termination transmits data in a predetermined timeslot, so that the data from the different terminations are assembled into a time division multiple access (TDMA) frame of predetermined format.

Recently, the PON principle has been expanded to form what is known as the SuperPON concept, in which high power optical amplifiers are used to allow very large, high split PONs to be built. For example, the use of optical amplifiers (such as fibre amplifiers) permits at least 3500 customers to be connected to a single head-end station over distances of up to 200 km.

Unfortunately, optical amplifiers can normally only be used on a downstream SuperPON, as the use of amplifiers on an upstream SuperPON would cause noise problems resulting from the superposition of amplified stimulated emissions (ASEs) from the amplifiers. One way of providing amplification in an upstream SuperPON is to replace the last level of split (that is to say the level of split nearest the head-end) by a repeater. This device includes a respective receiver for each incoming branch fibre and a transmitter; the receivers each converting incoming optical signals to electrical signals, amplifying them, and converting the amplified electrical signals to optical signals for onward transmission by the transmitter. Alternatively, each of the fibres leading to the last level of split is provided with a repeater.

Binary data consists of two logic levels, logic level '1' lying above and logic level '0' lying below a pre-set logic threshold. Conventional telecommunications data signals often have a mark-space ratio close to unity. In burst mode, this ratio may be much lower (1:100 or less), as a burst of data may be followed by a long period of silence. Bursts of data from different sources may have different amplitudes, and the bursts may be interleaved, in packet form, to share the same transmission channel. FIGS. 1a and 1b illustrate the differences between conventional data signals and burst mode data signals.

A signal which passes through an optical network undergoes attenuation and degradation. Consequently a logic decision threshold must be established at a receiver for the correct identification of each individual bit of data as either a '0' or '0' for subsequent logic processing. It would be desirable, because of its simplicity, to set a constant threshold for all levels of incoming signal. However, if the signal level is varying, a means for automatically altering the threshold may have to be introduced. In the case of a burst mode system, the threshold setting may have to be altered on a burst-by-burst basis, requiring either a very fast acting automatic level detection and threshold setting circuit, or a system with prior knowledge of the level of the incoming bursts which programmes a threshold setting circuit. Clearly, both these approaches lead to some complexity, and often require the use of dc-coupled amplifier stages with consequent problems of drift which may require temperature or other compensation.

SUMMARY OF THE INVENTION

The aim of the invention is to provide a different method of processing incoming data bursts which avoids the need for altering the logic decision threshold, which can operate with bursts which differ considerably in level, which has a capability for wide dynamic range, and which avoids the need for dc-coupled amplifiers.

The present invention provides a burst mode optical digital receiver comprising an opto-electronic detector, up-conversion means for up-converting the frequency of the output of the opto-electronic detector, amplifier means for amplifying the up-converted signal, and down-conversion means for down-converting the frequency of the amplified signal.

Advantageously, the up-conversion means is constituted by a first frequency mixer and an oscillator, the oscillator inputting a carrier of predetermined frequency to the first mixer for mixing with the output of the opto-electronic detector. The down-conversion means may be constituted by a second frequency mixer and an oscillator, the oscillator inputting a carrier of predetermined frequency to the second mixer for mixing with the amplified signal. Preferably, the same oscillator provides the carrier frequency for each of the mixers. For example, if the data rate of the input optical signal is in the region of 300 Mbits$^{-1}$, the oscillator provides a carrier frequency in the region of 500 MHz to each of the mixers.

In a preferred embodiment, the amplifier means is constituted by a first amplifier, a second amplifier and a signal limiter in series, the first and second amplifiers providing good gain, low noise, good linearity and a bandwidth of approximately 10–1000 MHz, and the signal limiter being effective to reduce the range of output pulse amplitudes.

Advantageously, the receiver further comprises a first filter positioned upstream of the first mixer, the first filter being effective to remove the effects of signal degradation caused by the detector and of noise at the output of the detector.

The receiver may further comprise a second filter positioned downstream of the second mixer, the second filter being effective to reduce noise and out-of-band harmonics produced by the signal limiter.

Preferably, a further amplifier and a third filter are positioned between the second mixer and the second filter, the third filter being effective to introduce over-shoot in the output pulses of the receiver, and the further amplifier being effective to isolate the second and third filters.

BRIEF DESCRIPTION OF THE DRAWINGS

By way of example, a specific embodiment of the invention will now be described with reference to the accompanying drawings, in which:

FIG. 5 is a complete circuit diagram of the receiver/repeater of FIG. 2; and

FIGS. 6a–6c illustrate the effects of extra filtering on pulse recognition.

DETAILED DESCRIPTION OF EXEMPLARY EMBODIMENTS

Figure 1A:
FIG. 1a shows conventional data signals.
Figure 1B:
FIG. 1b shows burst mode data signals.
Figure 2:
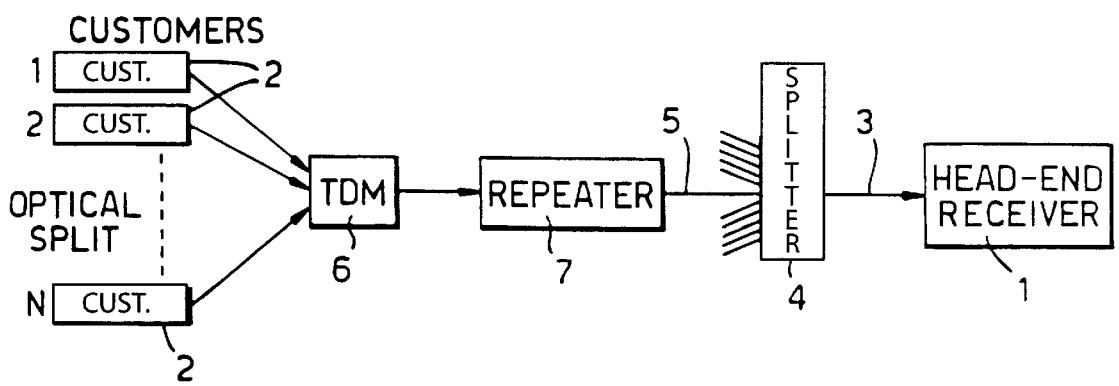
FIG. 2 is a schematic representation of an upstream PON.

Referring to the drawings, FIG. 2 shows an upstream PON having a head-end receiver 1 connected to a plurality of customer transmitters 2 via a single fibre 3, first level splitter 4, twelve fibres 5 (only one of which is shown), and a downstream multi-level split network indicated generally by the reference numeral 6. Each of the fibres 5 is provided with a receiver/repeater 7. A similar PON (not shown) is provided between a head-end transmitter and customer receivers for downstream transmission. The upstream PON shown is a SuperPON having up to 3500 customer transmitters 2 connected to the head-end receiver 1.

Figure 3:
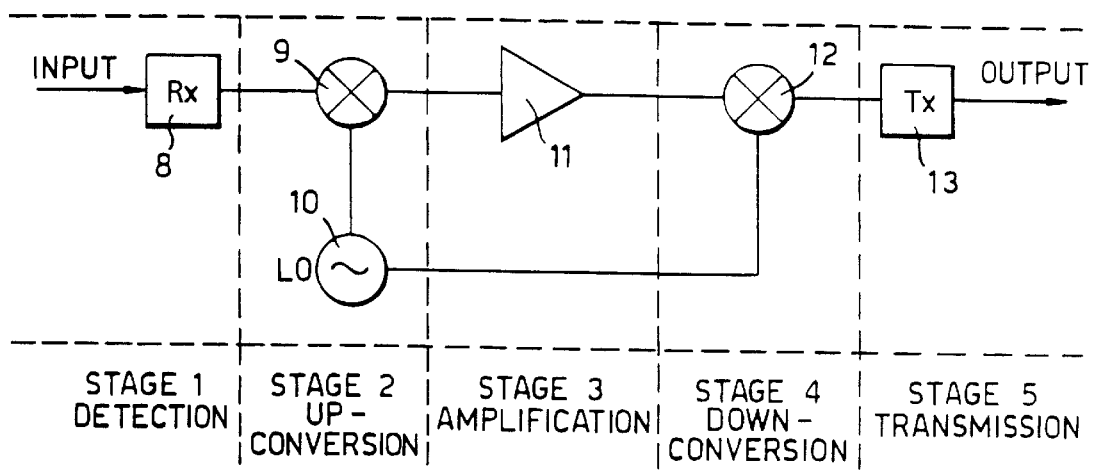
FIG. 3 is a circuit diagram of a receiver/repeater forming part of the network of FIG. 2.

Referring to FIG. 3, each receiver/repeater 7 includes an opto-electronic detector 8 which constitutes a stage 1 (detection) part of the circuit design. The detector 8 is a PINFET receiver, which has the advantages of low cost and low voltage supply. The detector has a sensitivity of about −39 dBm and a maximum input power of about −4 dBm (BER<10$^{-10}$). Alternatively, the detector 8 could be an avalanche photodiode (APD) receiver, which has the advantage of better sensitivity than a PINFET, but is more expensive. The input to the detector 8 is an optical signal having a data rate of 300 Mbit/s, and the output is an electrical signal which is input to a ZFM-150 mixer (Mini Circuits) 9, which mixes the electrical input signal with a carrier signal at 500 MHz. The carrier frequency is provided by a local oscillator 10. The mixer 9 and the local oscillator 10 provide stage 2 (up-conversion) of the circuit design of the receiver/repeater 7. The output of stage 2 is, therefore, an up-converted signal, and this has the advantage of containing no dc components, so that problems involved with dc-level drift and dc amplifier design can be avoided. Thus, with ac-coupling, there is no need for physically large capacitors between the different stages, which results in a more compact design of the receiver/repeater 7.

The up-converted signal is input to an amplifier 11, whose output leads to a second ZFM-150 mixer 12. The mixer 12 is also driven by the local oscillator 10, and acts to down-convert the RF signal and recover the amplified bit sequence. The output of the local oscillator 10 is fed to the two mixers 9 and 12 via a power splitter (not shown) with a 6 dB insertion loss, requiring a total local oscillator power of 14.5 dBm. The amplifier 11 constitutes stage 3 (amplification) of the circuit design, and the mixer 12 constitutes stage 4 (down-conversion). The output of the mixer 12 leads to a transmitter 13 which constitutes stage 5 (transmission) of the circuit design.

Figure 4:
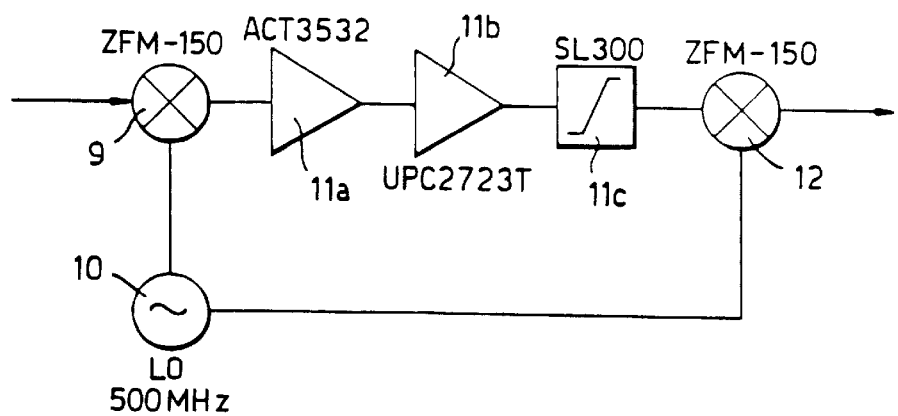
FIG. 4 is a circuit diagram of part of the receiver/repeater of FIG. 3.

FIG. 4 shows stages 2, 3 and 4 of the circuit of FIG. 3 in greater detail. In particular, the amplifier 11 is constituted by an ACT 3532 (Avantek) amplifier 11a, a UPC 2723T (NEC) amplifier 11b and a SL 300 (B&H) signal limiter 11c. This cascaded amplifier 11a, 11b provides good gain, low noise, good linearity and a bandwidth of approximately 10–1000 MHz. The amplifier 11b has the additional advantage of variable voltage-controlled gain. Alternatively, a second UCT 2723T amplifier may replace the ACT 3532 amplifier. The signal limiter 11c is used to reduce the range of output pulse amplitudes, and to protect the RF input to the down-conversion mixer 12 from excessive power levels. The limiter 11c does, however, produce out-of-band harmonics which need to be attenuated after down-conversion (as will be described below). Thus, stages 1 to 4 of the circuit produce amplified pulses having a relatively small range of amplitudes (compared to the range of input pulse amplitudes). The output pulses are then used to trigger a logic threshold, thereby providing pulses of constant amplitude to the transmitter 13 which then acts as a burst mode transmitter.

FIG. 5 is a circuit diagram showing the complete receiver/repeater 7. This circuit includes a first low-pass Butterworth filter 14 (300 MHz, third order) positioned between the detector 8 and the mixer 9. This filter 14 removes the effects of signal degradation which occurs in the detector 8, as well as any noise present on the input signal to the detector which is slightly exaggerated at the output of the detector. Similarly, a second low-pass Butterworth filter 15 (300 MHz, third order) is positioned between the mixer 12 and the transmitter 13. This filter 15 reduces the effect of noise and the out-of-band harmonics referred to above.

The receiver circuit has a sensitivity of −37 dBm, and a dynamic range of about 18 dB (BER<10$^{-10}$). The dynamic range is limited by the presence of baseline noise or distortion caused by imperfect pulses from the upstream transmitter. For a high amplitude burst, this baseline noise has a greater amplitude than the maximum level of a low amplitude burst. A further amplifier 16 and a third low-pass Butterworth filter 17 (300 MHz, fifth order) are positioned between the filter 15 and the transmitter 13. The filter 17 introduces some overshoot in the output pulses, and this forces the output to swing asymmetrically either side of zero volts, so that any base line noise or distortion does not cross the logic threshold. This effect is illustrated in FIGS. 6a to 6c. As a result, the dynamic range of the receiver/repeater 7 is increased to more than 20 dB. It should be noted, however, that, for a given threshold voltage, there is some trade-off between sensitivity and dynamic range.

The amplifier 16 is needed to isolate the two filters 15 and 17. This may advantageously be a DC coupled circuit or amplifier with very low frequency cut-off rather than the ACT 3532 amplifier illustrated. If the amplifier 16 were not present, any mismatch between the filters 15 and 17 would cause reflections from the filter 17 to be passed back via the filter 15 into the early stages of the receiver/repeater 7 and this would be undesirable.

It would, of course, be possible to dispense with the amplifier 16 if the filter 15 is not required, though it will be appreciated that the filter 17 is important as it helps ensure that the receiver/repeater 7 has a sufficient dynamic range.

The head-end receiver 1 is of the same basic design as the receiver/repeater 7 described above, but does not include the transmitter 13. In other words, the head-end receiver 1 is constituted by the first four stages of the receiver/repeater 7 of FIG. 3. The head-end receiver would, however, be provided with a decision circuit positioned at its output. This decision circuit is arranged to decide whether a "1" signal is above the predetermined threshold. Such a decision circuit may also be provided (between the filter 17 and the transmitter 13) in the receiver/repeater 7. It would also be possible for the customer receivers of the downstream PON to be of the same type as the head-end receiver 1. Alternatively, the customer receivers could be standard receivers provided with automatic gain control.

It will be apparent that the receiver/repeater described above could be modified in a number of ways. For example, it is possible to provide a receiver/repeater to replace the first level splitter 4. A receiver/repeater of this general type is described in greater detail in the specification of our European patent application 94308676.9. That receiver/repeater has 12 opto-electronic detectors, each of which is attached to one of the fibres 5, and a single transmitter for transmitting a multiplex of upstream signals to the head-end receiver 1. However, in a modified form of receiver/repeater according to the present invention each of the opto-electronic detectors would also be provided with up-conversion means, amplifier means and down-conversion means of the type described above.

What is claimed is:

1. An optical signal receiver comprising:
   conversion means for converting an optical signal to a first electronic signal;
   up-conversion means arranged in operation to output an up-converted electronic signal responsive to said first electronic signal;
   amplifier means arranged in operation to output an amplified electronic signal responsive to said up-converted electronic signal; and
   down-conversion means arranged in operation to output a down-converted electronic signal responsive to said amplified electronic signal.

2. A receiver as claimed in claim 1, wherein the up-conversion means comprises a first frequency mixer arranged in operation to input said first electronic signal and a first carrier signal of predetermined frequency, and to mix those signals to provide said up-converted signal.

3. A receiver as claimed in claim 1, wherein the down-conversion means comprises a second frequency mixer arranged in operation to input said amplified electronic signal and said carrier signal and to mix these signals to provide said down-converted electronic signal.

4. A receiver according to claim 2, further comprising an oscillator means arranged in operation to provide said carrier signal.

5. A receiver as claimed in claim 1 further comprising a signal limiter arranged to input said down-converted electronic signal and to output a rationalized digital signal.

6. A receiver according to claim 1 further comprising a first filter arranged in operation to input said first electronic signal and to output a first filtered electronic signal to said up-conversion means.

7. A receiver as claimed in claim 5, further comprising an intermediate filter arranged in operation to input said down-converted signal and to output a filtered down-converted signal and being effective to reduce noise and out-of-band harmonics produced by said signal limiter.

8. A receiver as claimed in claim 7 further comprising:
   an output filter means; and
   an output amplifier means interposed between said intermediate filter means and output filter means to isolate said intermediate and output filters;
   wherein said output amplifier is arranged in operation to output an amplified digital signal responsive to said down-converted signal; and
   said output filter means is effective, responsive to said output digital signal, to introduce overshoot to provide an enhanced down-converted output signal.

9. A receiver according to claim 1, further comprising an output filter means effective to introduce, responsive to said down-converted signal, overshoot to provide an enhanced down-converted signal.

10. An optical signal repeater comprising:
    a receiver as claimed in claim 1; and
    conversion means for converting the signal output by said receiver to an optical signal.

11. An optical signal receiver comprising:
    an opto-electronic converter connected to receive an optical signal and output a first electronic signal corresponding thereto;
    an up-converter connected to receive said first electronic signal and to output an up-converted electronic signal responsive thereto;
    an amplifier connected to receive said up-converted electronic signal and to output an amplified electronic signal responsive thereto; and
    a down-converter connected to receive said amplified electronic signal and to output a down-converted electronic signal responsive thereto.

12. A receiver as in claim 11 wherein the up-converter comprises a first frequency mixer connected to accept input of said first electronic signal and a first carrier signal of predetermined frequency, and to mix those signals to provide said up-converted signal.

13. A receiver as in claim 12 further comprising an oscillator connected to provide said carrier signal.

14. A receiver as in claim 11 wherein the down-converter comprises a second frequency mixer connected to accept input of said amplified electronic signal and said carrier signal and to mix these signals to provide said down-converted electronic signal.

15. A receiver as in claim 11 further comprising a signal limiter connected to accept input of said down-converted electronic signal and to output a rationalized digital signal.

16. A receiver as in claim 15 further comprising an intermediate filter connected to accept input of said down-converted signal and to output a filtered down-converted signal to reduce noise and out-of-band harmonics produced by said signal limiter.

17. A receiver as in claim 16 further comprising:

an output filter; and an output amplifier interposed between said intermediate filter and output filter to isolate said intermediate and output filters;

wherein said output amplifier is connected to output an amplified digital signal responsive to said down-converted signal; and said output filter is effective, responsive to said output digital signal, to introduce overshoot to provide an enhanced down-converted output signal.

18. A receiver as in claim 11 further comprising a first filter connected to accept input of said first electronic signal and to output a first filtered electronic signal to said up-converter.

19. A receiver as in claim 11, further comprising an output filter effective to introduce, responsive to said down-converted signal, overshoot to provide an enhanced down-converted signal.

20. An optical signal repeater comprising:

a receiver as in claim 11; and a converter connected to convert the signal output by said receiver to an optical signal.

21. An optical signal receiving method comprising:

converting an optical signal to a first electronic signal;

up-converting said first electronic signal to provide an up-converted electronic signal;

amplifying said up-converted electronic signal to provide an amplified electronic signal; and down-converting said amplified electronic signal to provide a down-converted electronic signal.

22. A method as in claim 21 wherein the up-converting process comprises mixing said first electronic signal and a first carrier signal of predetermined frequency to provide said up-converted signal.

23. A method as in claim 21 wherein the down-converting process comprises mixing said amplified electronic signal and said carrier signal to provide said down-converted electronic signal.

24. A method as in claim 21 further comprising limiting said down-converted electronic signal to output a rationalized digital signal.

25. A method as in claim 24, further comprising intermediate filtering of said down-converted signal to output a filtered down-converted signal effective to reduce noise and out-of-band harmonics produced by said limiting process.

26. A method as in claim 25 further comprising:

output filtering and amplifying an output of said intermediate filtering process to isolate said intermediate and output filtering processes, wherein said output amplifying step is arranged in operation to output an amplified digital signal responsive to said down-converted signal; and said output filtering process is effective, responsive to said output digital signal, to introduce overshoot to provide an enhanced down-converted output signal.

27. A method as in claim 21 further comprising filtering said first electronic signal to output a first filtered electronic signal to said up-converting process.

28. A method as in claim 21 further comprising output filtering said down-converted signal to introduce overshoot to provide an enhanced down-converted signal.

29. A method for repeating an optical signal comprising:

receiving an optical signal as in claim 21; and converting the output received signal to an optical signal.

* * * * *